(12) United States Patent
Rezvani et al.

(10) Patent No.: US 6,633,073 B2
(45) Date of Patent: Oct. 14, 2003

(54) METHOD AND APPARATUS FOR ISOLATING CIRCUITS USING DEEP SUBSTRATE N-WELL

(75) Inventors: Ali Rezvani, San Jose, CA (US); Douglas Sudjian, Santa Clara, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/895,823

(22) Filed: Jun. 29, 2001

(65) Prior Publication Data

US 2003/0013268 A1 Jan. 16, 2003

(51) Int. Cl.$^7$ .............................................. H01L 29/00
(52) U.S. Cl. ........................ 257/504; 257/500; 438/218; 438/219; 438/353
(58) Field of Search ................................ 257/500, 504; 438/218, 219, 294, 353, 400

(56) References Cited

U.S. PATENT DOCUMENTS 6,020,614 A * 2/2000 Worley ........................ 257/349
6,349,067 B1 * 2/2002 Hsu et al. .................... 365/206

* cited by examiner

*Primary Examiner*—Nathan J. Flynn
*Assistant Examiner*—Scott R Wilson
(74) *Attorney, Agent, or Firm*—Withrow & Terranova, PLLC (57) ABSTRACT

Techniques to isolate noise-sensitive circuits from noise generated by nearby circuits. In one design, a quiet region is formed on a die when surrounded by a deep n-well formed on top of a p-type substrate. The deep n-well is heavily doped n-type and forms a depletion region at the junction with the p-type substrate. The depth and width of the depletion region is dependent on the doping concentration of the deep n-well and the amount of reverse bias voltage applied to the deep n-well. In general, a wider and deeper depletion region may be formed by more heavily doping the deep n-well and applying a higher reverse bias voltage. By properly constructing the deep n-well and applying a high reverse bias voltage, a deep and wide depletion region may be formed to provide a barrier against noise from entering the quiet region.

21 Claims, 8 Drawing Sheets

METHOD AND APPARATUS FOR ISOLATING CIRCUITS USING DEEP SUBSTRATE N-WELL

BACKGROUND OF THE INVENTION

The present invention relates generally to circuits and more specifically to techniques for isolating sensitive circuits from noise using deep substrate n-well.

In today's circuits, it is becoming increasingly more common for circuits of diverse functionality to be fabricated on a single integrated circuit (i.e., chip). A mixed-signal integrated circuit includes both analog and digital circuits to respectively perform analog and digital processing on signals. Analog circuits are typically more sensitive to noise than digital circuits. This is due to the fact that analog circuits are typically operated in the linear region, whereas digital circuits often transition between two operating points outside the linear region.

The signals operated on by analog circuits may be in the milli-volts range, and a small amount of noise can distort or destroy these signals. In comparison, digital circuits typically operate on signals at two fixed voltages, e.g., ground and a supply voltage, $V_{DD}$. In addition, digital circuits can cause a large amount of switching noise during operation. Therefore, it is a common practice to separate these two types of circuits on the integrated circuit to prevent noise generated by the digital circuits from coupling onto the analog circuits.

As circuits migrate to lower power supply voltages (e.g., 5.0V, 3.3V, 2.0V, 1.5V, and lower), they become more susceptible to noise. The lower supply voltages result in smaller signal amplitude, which in turn decreases the noise margins of the circuits. In this environment, even a small amount of noise may be enough to cause a circuit to function erroneously.

To reduce cost, it is desirable to integrate multiple types of circuits into a single mixed-signal chip. This results in integrating circuits of diverse functionality onto the same die. Since die area is typically quite expensive, these different types of circuits are often packed as close together as possible to maximize die usage. As a result of circuits being placed close to each other, the noise generated by the (e.g., digital) circuits can more easily couple to and degrade the performance of the neighboring (e.g., analog) circuits.

There is therefore a need in the art for techniques to provide isolation for sensitive circuits from noise generated by other circuits on the same chip.

SUMMARY OF THE INVENTION

The invention provides techniques to isolate noise-sensitive circuits from noise generated by nearby circuits. In one design, a quiet region is formed on a die when surrounded by a deep n-well formed on top of a p-type substrate. The deep n-well is heavily doped n-type and forms a depletion region at the junction with the p-type substrate. The depth and width of the depletion region is dependent on the doping concentration of the deep n-well and the amount of reverse bias voltage applied to the deep n-well. In general, a wider and deeper depletion region may be formed by (1) more heavily doping the deep n-well and (2) applying a higher reverse bias voltage to the deep n-well. However, heavier doping of the deep n-well also results in a lower breakdown voltage, which then limits the magnitude of the reverse bias voltage that may be applied. By properly constructing the deep n-well and applying a high reverse bias voltage, a deep and wide depletion region may be formed to provide a barrier against noise from entering the quiet region.

In one aspect, the deep n-well may be heavily doped with n-type using various techniques. In one technique, high-energy ion implantation may be used to dope the deep n-well. With this technique, the doping concentration for the deep n-well is generally greater toward the junction between the deep n-well and the p-type substrate, which then allows a wider and deeper depletion region to be formed for a given reverse bias voltage. However, the breakdown voltage is also lower for the heavier doping concentration. In another technique, low-energy ion implantation may be used to dope the deep n-well. With this technique, ions are implanted on the surface of the deep n-well and driven into the well via heat.

In another aspect, a voltage pump is used to provide a reverse bias voltage for the p-n junction formed between the deep n-well and p-type substrate. The depletion region formed at the p-n junction may be controlled based on the reverse bias voltage applied to the deep n-well. By using the voltage pump, a reverse bias voltage greater than a supply voltage for the die may be generated and used to provide a wider and deeper depletion region, which then provides improved noise protection for the quiet region. The reverse bias voltage applied to the deep n-well is maintained to be less than the breakdown voltage for the p-n junction.

Various other aspects, embodiments, and features of the invention are also provided, as described in further detail below.

The foregoing, together with other aspects of this invention, will become more apparent when referring to the following specification, claims, and accompanying drawings.

DESCRIPTION OF THE SPECIFIC EMBODIMENTS

Figure 1A:
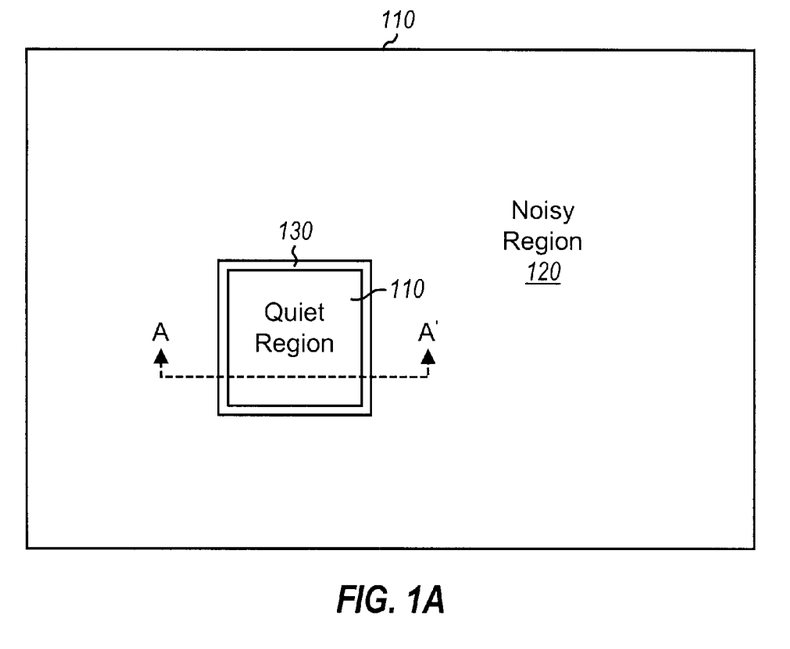
FIG. 1A is a diagram of a top-view of a mixed-signal integrated circuit that implements various aspects and embodiments of the invention.

FIG. 1A is a diagram of a top-view of a mixed-signal integrated circuit 100 that implements various aspects and embodiments of the invention. Integrated circuit 100 includes a quiet region 110 that occupies a portion of the integrated circuit and is surrounded by remaining (typically more noisy) region 120. The quiet and noisy regions 110 and 120 are separated by a deep substrate n-well 130, which functions to isolate the quiet region from noise generated by the noisy region.

Quiet region 110 may be used to implement various types of analog (or possibly digital) circuits that may be sensitive to noise. These analog circuits may include, for example, oscillators, phase lock loops, amplifiers, filters, and so on. Noisy region 120 may be used to implement digital circuits that are typically more immune to noise. In fact, the circuits in noisy regions 120 are often the culprits that generate large amounts of switching noise, which then couples to and affects the performance of the circuits in quiet region 110. Deep n-well 130 may be fabricated and operated in a manner described in further detail below.

Figure 1B:
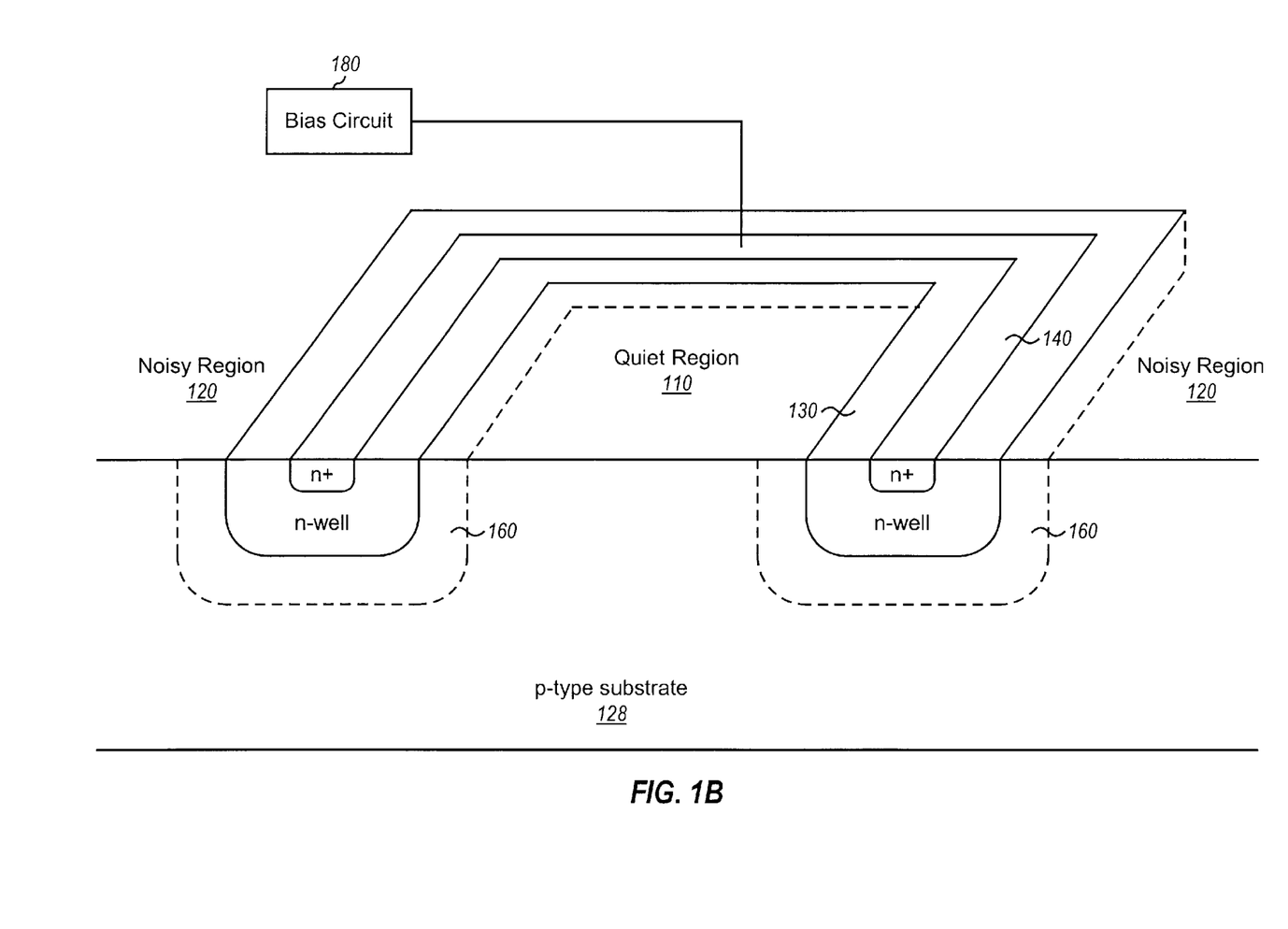
FIG. 1B is a diagram of a cross-sectional view of a portion of the mixed-signal integrated circuit in accordance with an aspect of the invention.

FIG. 1B is a diagram of a cross-sectional view of a portion of mixed-signal integrated circuit 100, in accordance with an aspect of the invention. FIG. 1B is a view along line A–A' in FIG. 1A and shows the substrate isolation for quiet region 110. The substrate isolation may be used to provide improved noise protection for the circuits fabricated in quiet region 110 against neighboring circuits in noisy region 120.

In the embodiment shown in FIG. 1B, integrated circuit 100 is fabricated on a p-type substrate 128. Deep n-well 130 is fabricated on top of p-type substrate 128 and encloses a sufficient area required for the circuits to be fabricated in quiet region 110. The deep n-well ring can take on any size and shape (e.g., rectangle, square, round, oval, and so on). An n+ region ring 140 is further fabricated on top of the deep n-well ring and provides a means for applying a reverse bias voltage to deep n-well 130.

Deep n-well 130 is doped by an n-type concentration. Various doping schemes for deep n-well 130 may be used and are described in further detail below. When a reverse bias voltage is applied to deep n-well 130, a depletion region 160 is formed which extends farther into p-type substrate 128. Depletion region 160 provides the substrate isolation between quiet region 110 and noisy region 120.

The amount of substrate isolation between quiet region 110 and noisy region 120 is dependent on the width and depth of depletion region 160. Generally, greater substrate isolation and improved noise immunity are achieved when the depletion region is wider and deeper. The depletion region width and depth are, in turn, dependent on various factors such as (1) the concentration and profile of the ions in deep n-well 130 and (2) the amount of reverse bias voltage applied to the p-n junction formed between deep n-well 130 and p-type substrate 128.

In accordance with an aspect of the invention, the n-type in deep n-well 130 is strongly doped with a particular ion concentration profile such that a larger (i.e., wider and deeper) depletion region 160 may be formed. By extending depletion region 160 farther into p-type substrate 128, an improved isolation barrier may be achieved for the circuits in quiet region 110 to block out noise that may be generated by the circuits in noisy region 120. A higher doping of the n-type for deep n-well 130 can result in a larger depletion region and a corresponding deeper isolation barrier. This deeper isolation region acts as a resistive barrier that channels (i.e., directs or steers) substrate noise around quiet region 110.

In accordance with another an aspect of the invention, a high reverse bias voltage is applied to the p-n junction formed between deep n-well 130 and p-type substrate 128 to provide a larger depletion region 160. In fact, this reverse bias voltage may be greater than the power supply voltage used for integrated circuit 100. As described below, the high reverse bias voltage increases the width and depth of depletion region 160, which increases the isolation barrier. However, the reverse bias voltage is maintained to be less than the breakdown voltage of the p-n junction. Techniques for generating the high reverse bias voltage are also described in further detail below.

The magnitude of the reverse bias voltage may be limited by the ion concentration profile for the n-type in deep n-well 130. This interdependency between ion concentration profile and reverse bias voltage is described in further detail below. The desired depletion region width and depth may thus be achieved by both controlling the ion concentration for the n-type in deep n-well 130 and the applying the proper amount of reverse bias voltage to the p-n junction between deep n-well 130 and p-type substrate 128.

In accordance with an aspect of the invention, various techniques may be used to dope deep n-well 130 in order to achieve the desired substrate isolation for quiet region 110. These different doping techniques may be used to provide different ion concentrations and profiles for the deep n-well. These doping techniques include, for example, a high-energy ion implantation technique and a low-energy ion implantation technique.

Figure 2A:
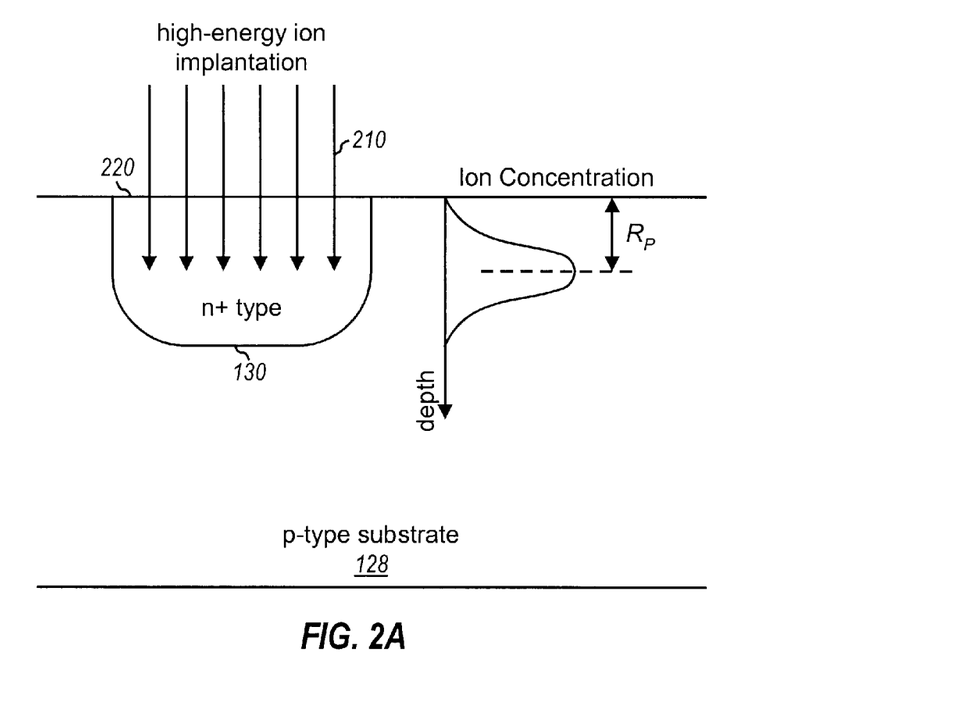
FIG. 2A is a diagram illustrating the doping of the deep n-well using high-energy ion implantation.

FIG. 2A is a diagram illustrating the doping of deep n-well 130 using the high-energy ion implantation technique. In high-energy ion implantation, a high-energy beam 210 of impurity ions, which are donor atoms, is used to form the n-type for the deep n-well. Energy beam 210 is directed to a surface 220 of the n-type region for deep n-well 130. In the process of implantation, these ions are accelerated to kinetic energies ranging from several kilo-electron volts (keV) to several mega-electron volts (MeV). As the donor atoms enter the crystal structure in the n-type region, they give up their energy to the lattice in collisions and finally come to rest at some penetration depth. This penetration depth is different depending on the properties of the donor atom (i.e., its mass, atomic number) and its implantation energy.

Figure 2B:
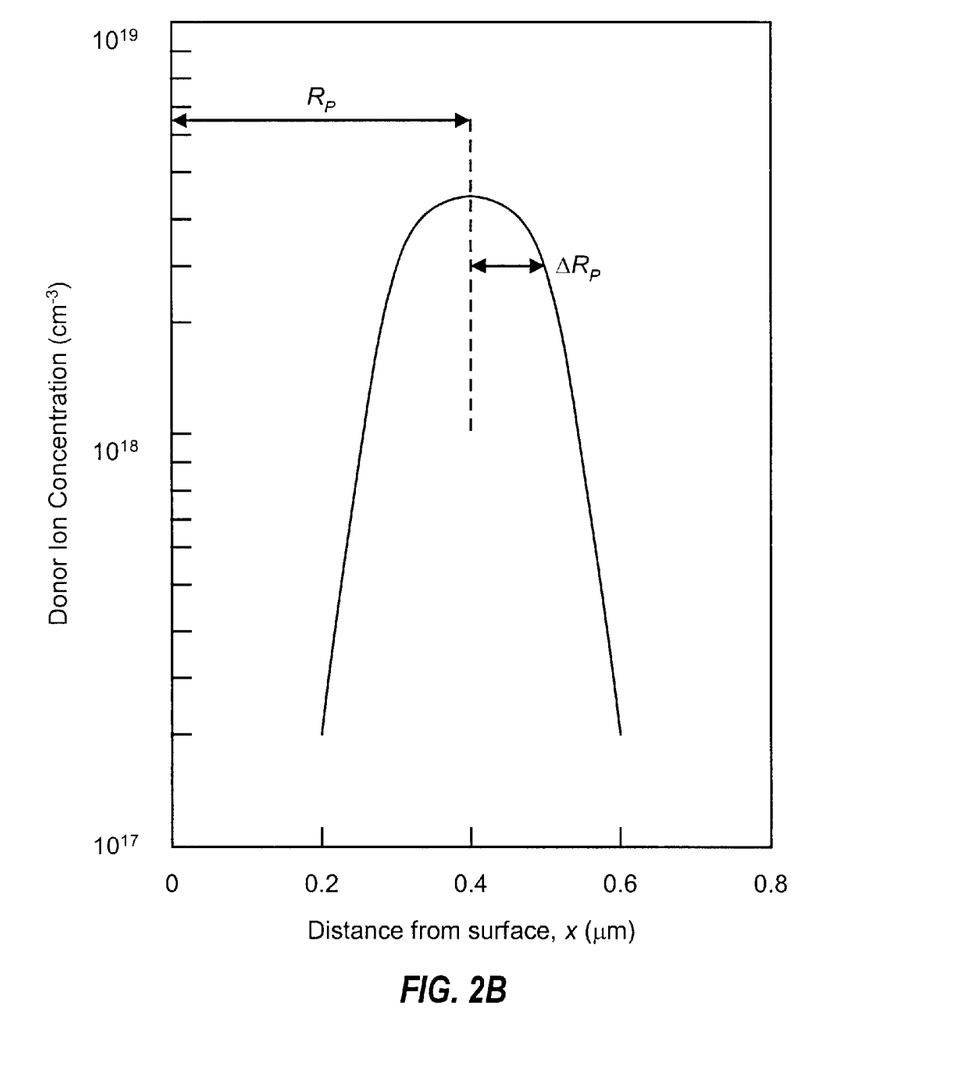
FIG. 2B shows a Gaussian distribution of an implanted n-type donor Phosphorus or Arsenic at a dose of $10^{14}$ atoms/cm$^2$ implanted at 100 keV.

FIG. 2A also shows a distribution of the ions (i.e., an icon concentration profile) in deep n-well 130 for the high-energy ion implantation technique. As shown in the right side of FIG. 2A, the ions come to rest at various depths of deep n-well 130 distributed almost symmetrically about a projected range $R_p$. Furthermore, the ions follow a distribution that may be approximated by the following Gaussian expression:

$$n(x) = \left\{ \frac{\Phi}{\sqrt{2\pi}\,\Delta R_p} \exp\left[-\frac{1}{2}\left(\frac{x - R_p}{\Delta R_p}\right)^2\right] \right\}, \quad \text{Eq (1)}$$

where $\Phi$ is the implanted dose of donor atoms in ions/cm$^2$, x is the distance into the surface of the implanted region (i.e., the penetration depth), $\Delta R_p$ is half of the width of the distribution (i.e., from the peak of the ion concentration profile in FIG. 2B to a point that is $e^{-1/2}$ from the peak), and n(x) is the ion concentration at the distance of x from the surface. Note that both $R_p$ and $\Delta R_p$ increase with increasing implantation energy. This indicates that the depth of the deep n-well may be controlled by using various implantation energies.

FIG. 2B shows a Gaussian distribution of an implanted n-type donor Phosphorus or Arsenic at a dose of $10^{14}$ B atoms/cm$^2$ implanted at 100 keV. The highest donor concentration occurs at the projected range $R_p$ into the surface of the n-type well. This distribution is not uniform, which can result in a non-uniform depletion region into the substrate. However, by performing several implantations at different energies, it is possible to achieve a desired ion concentration distribution (or profile), such as shown in FIG. 2C.

Figure 2C:
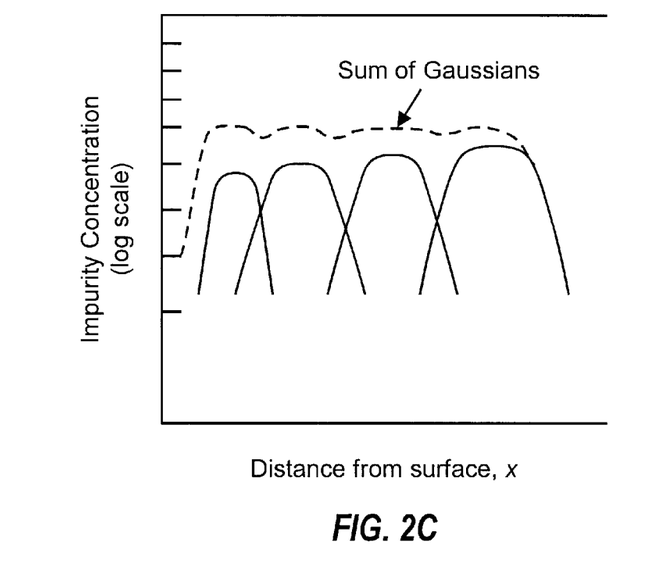
FIG. 2C shows a combination of four Gaussian distributions of an implanted donor Phosphorus or Arsenic at four different doses and energies to obtain a more uniform ion distribution across the depth of the deep n-well.

FIG. 2C shows a combination of four Gaussian distributions of an implanted donor Phosphorus or Arsenic at four different doses and energies to obtain a more uniform ion distribution across the depth of deep n-well 130. The ion distribution resulting from the four implantations is a sum of the individual Gaussian distributions and is more uniform than a single Gaussian distribution from one implantation. By applying this multiple-implantation technique, the doping may be controlled to be uniform (or to take on any profile) across the depth of the deep n-well. The uniform doping of the n region for the deep n-well may be used to form a uniform depletion layer when a reverse bias voltage is applied to the deep n-well.

For the high-energy ion implantation technique, the lattice of the n-type region may be damaged due to the collisions between the implanted ions and the lattice atoms. Most of this damage may be cured by heating or annealing the crystal after the implantation.

Figure 3:
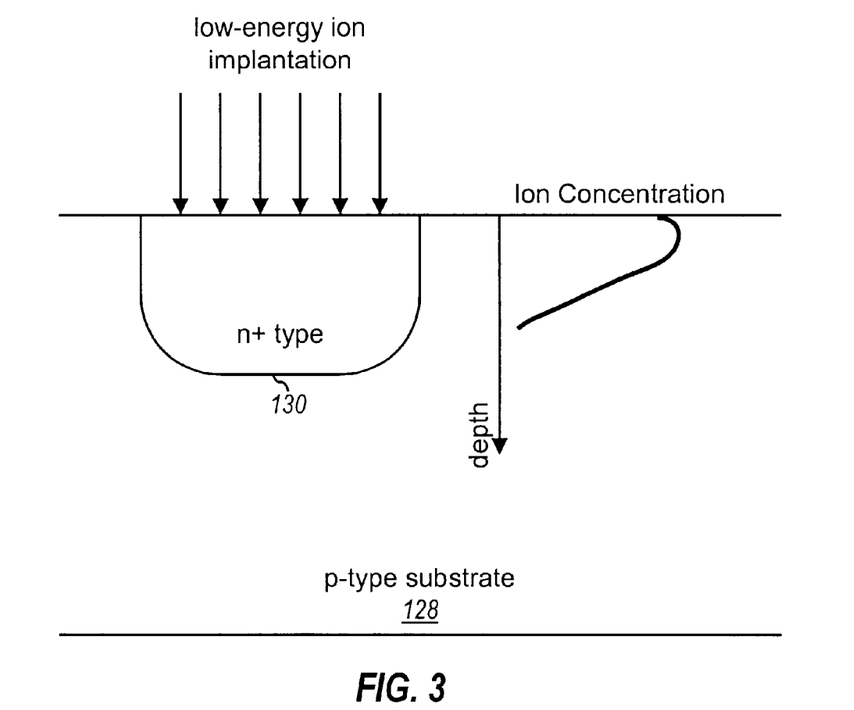
FIG. 3 is a diagram illustrating the doping of the deep n-well using low-energy ion implantation.

FIG. 3 is a diagram illustrating the doping of deep n-well 130 using the low-energy ion implantation technique. In low-energy ion implantation, donor ions are first implanted to the surface of the deep n-well, and these donor ions are thereafter driven into the deep n-well via a heating process. The heating process helps the ion concentration to diffuse into the deep n-well. This doping technique typically results in a higher ion concentration near the surface of the deep n-well, as shown by the ion distribution on the right side of FIG. 3. An advantage to this technique is that the break down voltage is larger than implanting the ions deeper into the n-well.

Figure 4A:
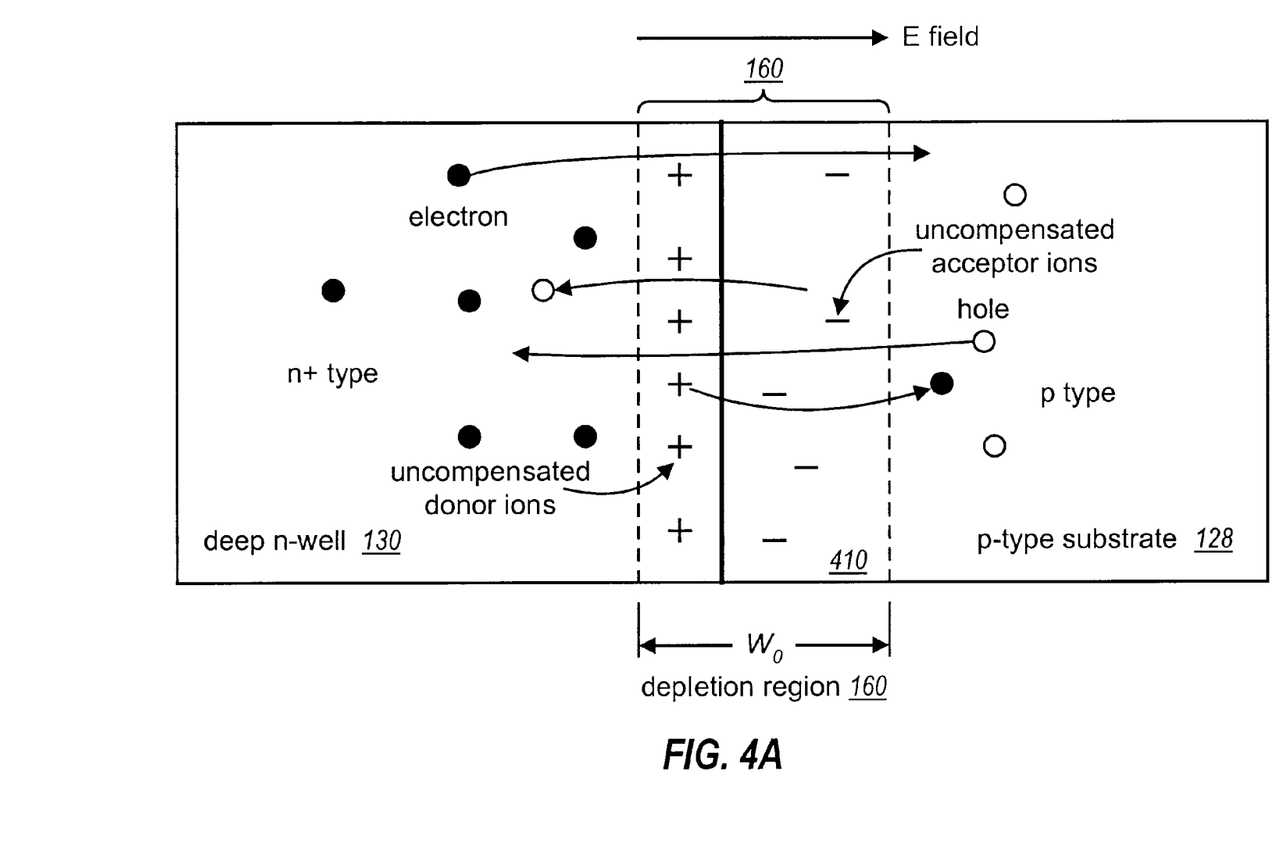
FIG. 4A is a diagram of a p-n junction formed when a region of p- and n-type semiconductor material are brought together.

FIG. 4A is a diagram of a p-n junction 410 formed when a region of p-type and n-type semiconductor materials are brought together. Junction 410 is formed between deep n-well 130 and p-type substrate 128. The n-type material inherently has a large concentration of electrons and few holes, whereas the converse is true for the p-type material. Because of the large carrier concentration gradients at the junction, diffusion of carriers occurs and the holes (which are positively charged ions) diffuse from the p side into the n side and the electrons diffuse from the n side into the p side. When diffusion occurs due to the concentration gradients, uncompensated donor and acceptor ions are left behind, forming the depletion region. This behavior results in a diffusion current, in the direction of the p side to n side. The diffusion current across a unit area (i.e., the current density) J(x) can be expressed as:

$$J(x) = qD_n \frac{dn(x)}{dx} - qD_p \frac{dp(x)}{dx}, \qquad \text{Eq (2)}$$

where q is the charge of the electron, $D_n$ and $D_p$ are respectively the electron and hole diffusion coefficient in units cm$^2$/s, and $$\frac{dn(x)}{dx}$$

and $$\frac{dp(x)}{dx}$$

are the carrier gradients for the n-type and p-type regions, respectively.

The diffusion current J(x) builds until an opposing electric field at the junction causes current flow in the opposite direction. The electric field is caused by the uncompensated donor and acceptor ions that were left behind during the act of diffusion, and exists only in the depletion region. Carriers in the depletion region are swept by the electric field and contribute to a drift current, in the direction of n side to p side. Hence, the drift current density can be expressed as:

$$J_x = q(n\mu_n + p\mu_p)\vec{E}_x = \sigma\vec{E}_x, \qquad \text{Eq (3)}$$

where q is the electron charge, and n and p are the number of electrons and holes, respectively. The electron and hole mobility, $\mu_n$ and $\mu_p$, describes the ease in which the electrons drift in the material. All of these factors determine how well current flows in the semiconductor.

When the diffusion current is equal to the drift current, equilibrium is reached. In addition, in equilibrium, the electric field is constant and results in a depletion region 160 having a fixed depletion region width, $W_0$.

Figure 4B:
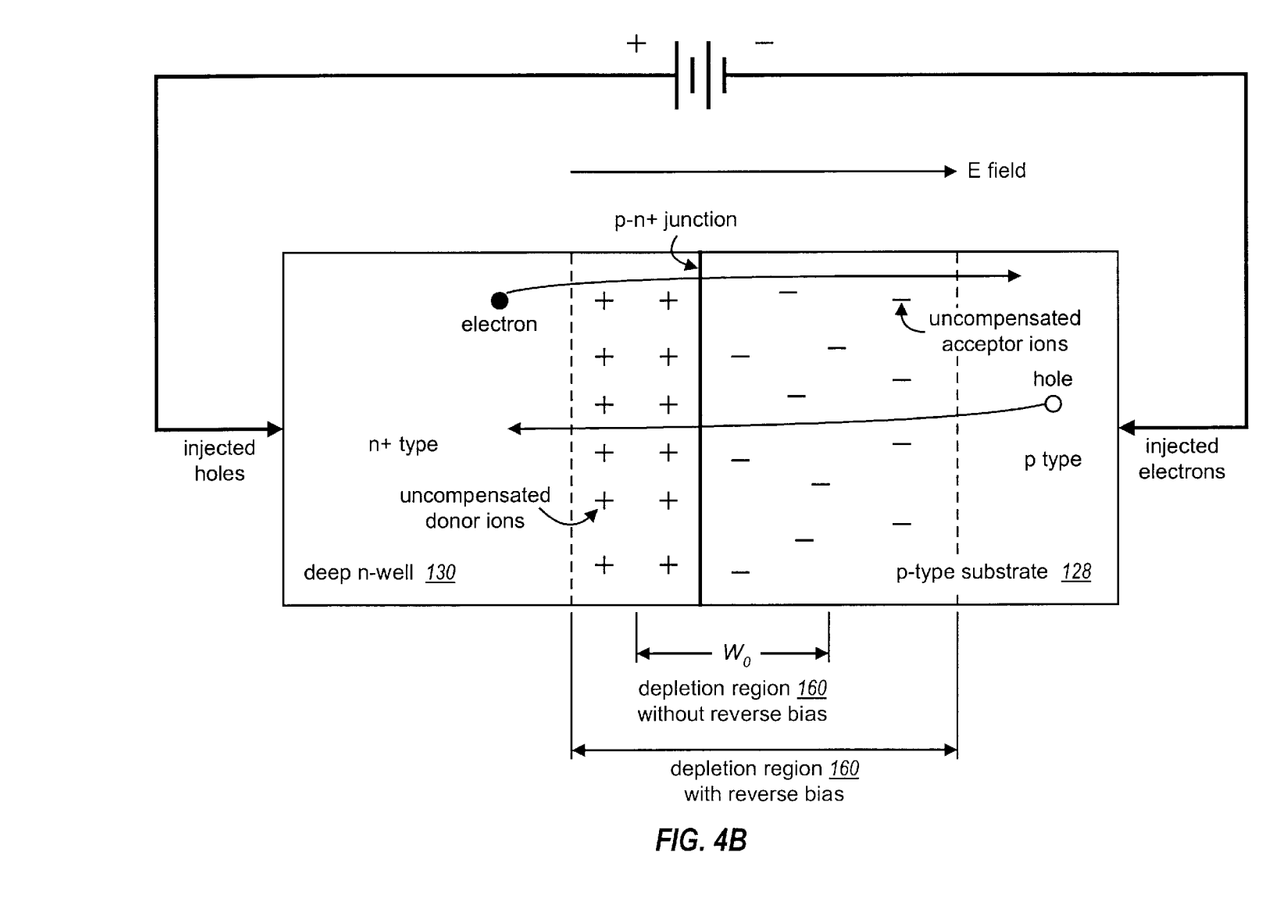
FIG. 4B is a diagram of the p-n junction when a reverse bias voltage is applied.

FIG. 4B is a diagram of the same p-n junction 410 when a reverse bias voltage is applied. Applying a reverse bias voltage at junction 410 causes holes to be injected into the n-type and electrons to be injected into the p-type. This results in donor ions in the n-type region recombining with the injected holes and acceptor ions in the p-type region recombining with the injected electrons (i.e., electron-hole recombining). This recombination results in more uncompensated ions on both sides of the junction, resulting in a wider depletion region 160. This also results in a stronger electric field.

Depletion region 160 extends farther into the side with the lighter concentration doping, which is p-type substrate 128. This is because a deep penetration is necessary in the more lightly doped material to "uncover" the same amount of space charge as for a shorter penetration into the more heavily doped material. This can be described as:

$$x_{p0} = \left\{ \frac{2\varepsilon V_0}{q} \left[ \frac{N_d}{N_a(N_a + N_d)} \right] \right\}^{1/2}, \qquad \text{Eq (4a)}$$

$$x_{n0} = \left\{ \frac{2\varepsilon V_0}{q} \left[ \frac{N_a}{N_d(N_a + N_d)} \right] \right\}^{1/2}, \qquad \text{Eq (4b)}$$

$$W = \left\{ \frac{2\varepsilon V_0}{q} \left[ \frac{1}{N_a} + \frac{1}{N_d} \right] \right\}^{1/2}, \text{ and} \qquad \text{Eq (4c)}$$

$$W = x_{p0} + x_{n0}, \qquad \text{Eq (4d)}$$

where $x_{p0}$ and $x_{n0}$ in equations (4a) and (4b) are the widths into the p-type and n-type, respectively. Equations (4c) and (4d) describe the calculation for the total width, W, of depletion region 160. Note that the total width of the depletion region is controlled by two factors. First, the width is controlled by the concentration doping of the p-type and n-type regions, $N_a$ and $N_d$. Second, the width is also controlled by the voltage potential, $V_0$, which is caused by the electric field in the depletion region. This electric field is made stronger when an external voltage source is used to reverse bias the junction.

Figure 4C:
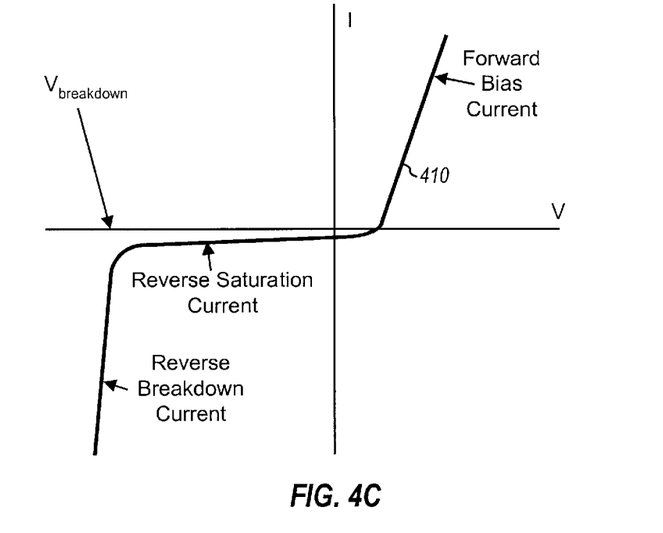
FIG. 4C is a graph of the current versus voltage (I–V) characteristic of the p-n junction.

FIG. 4C is a graph of the current versus voltage (I–V) characteristic of p-n junction 410. The upper right quadrant depicts a current through the p-n junction due to a forward bias voltage. Conversely, the lower left quadrant depicts a current through the p-n junction due to a reverse bias voltage. For a small reverse bias voltage, there is a small leakage current through the junction. As the reverse voltage is increased, the depletion region width is increased, as shown in equations (4a) through (4d). This results in a large electric field within the depletion region. At a critical electric field strength, electrons participating in covalent bonds are torn from the bonds by the electric field and accelerated to the n side of the junction. This results in a large current flow corresponding to a breakdown voltage. This breakdown condition is avoided for p-n junction 410 between deep n-well 130 and p-type substrate 128, since it effectively amounts to a short at the junction.

For the high-energy ion implantation technique shown in FIG. 2A, a Gaussian ion concentration profile (or some other uniform or non-uniform ion concentration profile) may be obtained. For the Gaussian ion concentration profile, the highest ion concentration is toward the middle of deep n-well 130. If the ion concentration is higher toward (or near) the p-n junction between deep n-well 130 and p-type substrate 128, then a larger depletion region may be obtained for a given reverse bias voltage, as shown in equations (4a) through (4d). However, the breakdown voltage is typically lower when the high ion concentration occurs near the p-n junction.

And for the low-energy ion implantation technique shown in FIG. 3, the ion concentration profile is such that the ion concentration is highest near the surface of deep n-well 130. Since the ion concentration is lower near the p-n junction between deep n-well 130 and p-type substrate 128, a smaller depletion region maybe obtained for a given reverse bias voltage, as shown in equations (4a) through (4d). However, the breakdown voltage is typically larger when the ion concentration is lower near the p-n junction. Thus, a higher reverse bias voltage may be applied to the p-n junction, which may then result in a larger depletion region 160.

In accordance with an aspect of the invention, a high reverse bias voltage is applied to the p-n junction between the highly doped n-type in the deep n-well and the p-type substrate to form a larger depletion region, which then acts as a barrier to prevent noise current generated by neighboring circuits from flowing across the depletion region. Typically, the higher the applied reverse bias voltage, the larger the depletion region, which then results in improved isolation against substrate current noise. However, as FIG. 4C illustrates, when breakdown occurs at the critical voltage, the junction provides no protection at all from noise.

The reverse bias voltage for the p-n junction between the deep n-well and the p-type substrate may be provided by a voltage source, which may be a power supply, a battery, a voltage regulator, or some other types of circuit. In an embodiment, a voltage pump circuit is used to provide a high voltage that is used to back-bias or reverse bias the p-n junction.

Figure 5:
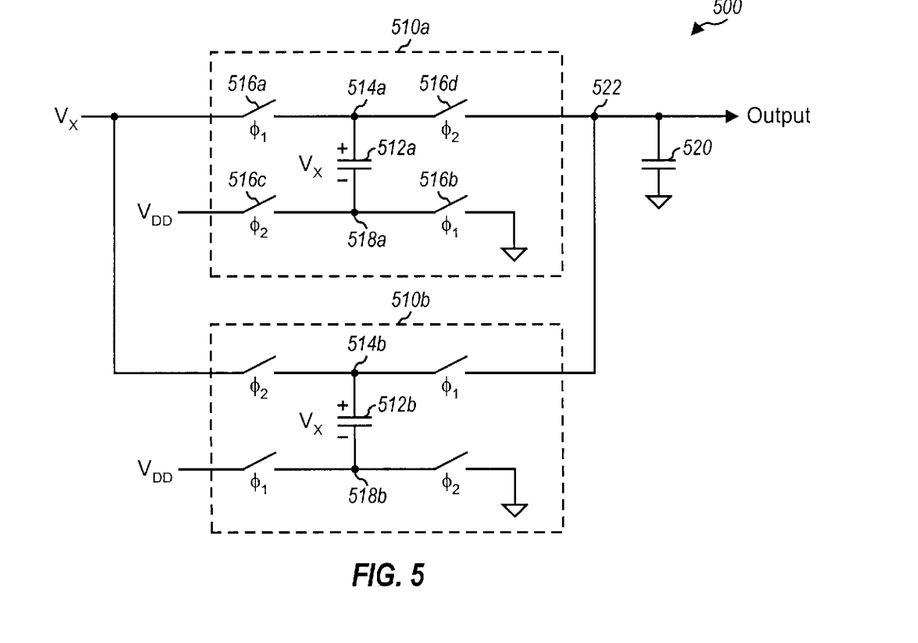
FIG. 5 is a schematic diagram of a voltage pump circuit that may be used to generate a high voltage to reverse bias the p-n junction between the deep n-well and p-type substrate.

FIG. 5 is a schematic diagram of a voltage pump circuit 500 that may be used to generate a high voltage to reverse bias the p-n junction between deep n-well 130 and p-type substrate 128. Voltage pump circuit 500 is one implementation of a bias circuit 180 in FIG. 1A.

Voltage pump circuit 500 provides a reverse bias voltage to the highly doped n+ region 140, which resides on top of deep n-well 130, as shown in FIG. 1B. In an aspect of the invention, this bias voltage is greater than the supply voltage for integrated circuit 100 in which deep n-well 130 is implemented.

In the embodiment shown in FIG. 5, voltage pump circuit 500 includes two voltage pump sections 510a and 510b that operate based on opposite phases of a clock signal. Each voltage pump section 510 utilizes a capacitor 512, which is pre-charged to a particular voltage, $V_X$, during one phase of the clock signal when capacitor 512 is not coupled to n+ region 140.

For voltage pump section 510a, during the first phase $\phi_1$ of the clock signal, switches 516a and 516b are closed, switches 516c and 516d are opened, and capacitor 512a is charged to voltage $V_X$ but not coupled to the output. During the second phase $\phi_2$ of the clock signal, switches 516c and 516d are closed, switches 516a and 516b are opened, and the voltage previously charged on capacitor 512a is used to charge a capacitor 520 at the output. Since capacitor 512a is already pre-charged to the voltage $V_X$ and node 518a is coupled to the power supply voltage $V_{DD}$, the voltage at positive node 514a of capacitor 512a is equal to $V_{DD}+V_X$, which is higher than the power supply voltage $V_{DD}$. This higher voltage is provided to the output of voltage pump section 510a and is used to charge capacitor 520.

For voltage pump section 510a, a voltage of $V_X$ is charged across capacitor 512a during the first clock phase $\phi_1$, and the voltage $V_{DD}+V_X$ from capacitor 512a is used to charge capacitor 520 during the second phase $\phi_2$. Voltage pump section 510b operates in similar manner but on the complementary clock phase. Thus, voltage pump section 510b charges capacitor 512b during the second clock phase, and a voltage of $V_{DD}+V_X$ from capacitor 512b is used to charge capacitor 520 during the first clock phase.

By using two voltage pump sections 510a and 510b to charge capacitor 520 on opposite phases of the clock signal, various advantages may be obtained. For example, less switching noise may be generated at node 522 since one capacitor 512 is used to charge this node on each clock phase. In an alternative design, a single voltage pump section 510 may be used to provide the reverse bias voltage for the p-n junction, and this is within the scope of the invention.

Capacitor 520 couples to the output (i.e., the heavily doped n+ region 140) and provides a high reverse bias voltage of $V_{DD}+V_X$ for the p-n junction. For a particular doping concentration in the n-type and p-type regions, this high reverse bias voltage allows the n-type region and the p-type substrate region to be strongly reverse biased, which then results in the deeper depletion region as shown in equations (4a) through (4d).

Other types of circuits may also be used to generate the bias voltage for the p-n junction and this is within the scope of the invention.

As noted above, improved substrate isolation is achieved between circuits in the quiet and noisy regions 110 and 120 when the depletion region 160 is larger (i.e., wider and deeper). The largest possible depletion region 160 is achieved by selecting the proper combination of ion concentration profile and reverse bias voltage. The particular combination that provides the largest possible depletion region may be different for each integrated circuit process technology.

In one specific implementation, the maximum reverse bias voltage that may be generated by a voltage source for the p-n junction between the deep n-well and p-type substrate is determined. The ion concentration profile that provides the largest possible depletion region and having a breakdown voltage greater than this maximum reverse bias voltage is then determined. The deep n-well is then doped in a manner to achieve this ion concentration profile.

For clarity, the noise isolation techniques of the invention have been specifically described for a heavily doped n-type region formed on top of a p-type substrate. The noise isolation techniques of the invention may also be implemented for a heavily doped p-type region formed on top of an n-type substrate, or some other combination thereof. For a heavily doped n-type region formed on top of a p-type substrate, the impurity used to dope the n-type region may be Phosphorus (P), Arsenic (As), or some other atom that has extra electrons in its valence energy band to characterize it as n-type material. The p-type substrate can be fabricated based on Si, GaAs, GaP, or any combination of atoms that provides for a charge neutrality. This p-type substrate is further doped by a p-type material, which may be Boron (B), Gallium (Ga), or any atoms that has extra holes in its valence energy band to characterize it as p-type material. In addition, the doping levels can be low, medium, or high in concentration.

The foregoing description of the specific embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein, and as defined by the following claims.

What is claimed is:

1. An integrated circuit having a plurality of types of circuits fabricated thereon and comprising:
   a p-type substrate;
   a first region located on top of the p-type substrate and used to fabricate a first type of circuits that are more sensitive to noise;
   a second region located on top of the p-type substrate and used to fabricate a second type of circuits that are less sensitive to noise;
   an n well formed on top of the p-type substrate and doped as n-type, wherein the n well surrounds the first region and separates the first and second regions; and
   a depletion region formed between the n well and the p-type substrate based on a reverse bias voltage applied to the n well
   wherein the n well doped as the n-type is heavily doped to achieve a particular ion concentration profile.

2. The integrated circuit of claim 1, further comprising:
   a voltage pump circuit configured to provide the reverse bias voltage.

3. The integrated circuit of claim 2, wherein the voltage pump circuit is implemented with a switched-capacitor circuit.

4. The integrated circuit of claim 1, wherein the reverse bias voltage is greater than a supply voltage for the integrated circuit.

5. The integrated circuit of claim 1, wherein the particular ion concentration profile is selected to provide a high breakdown voltage for a p-n junction formed between the n well and p-type substrate.

6. The integrated circuit of claim 1, wherein the particular ion concentration profile is selected to increase a depth and width of the depletion region for a particular amount of reverse bias voltage.

7. The integrated circuit of claim 1, wherein the n well is a heavily doped region and further reverse biased with a high voltage to increase a depth and width of the depletion region.

8. The integrated circuit of claim 1, wherein the n-type for the n well is a heavily doped region formed by high energy ion implantation.

9. The integrated circuit of claim 8, wherein doping concentration for the n well is greater toward a junction between the n well and the p-type substrate.

10. The integrated circuit of claim 8, wherein the high energy ion implantation is followed by an annealing process to repair lattice damage in the n-type.

11. The integrated circuit of claim 8, wherein doping concentration for the n well follows a Gaussian distribution about a particular projected range $R_p$.

12. The integrated circuit of claim 11, wherein implantation of ions to the projected range $R_p$, into the n well provides a deeper or wider depletion width when a reverse bias voltage is applied.

13. The integrated circuit of claim 8, wherein doping concentration for the n well is approximately uniform across a dept of the n well.

14. The integrated circuit of claim 1, wherein the n-type for the n well is a heavily doped region formed by low energy ion implantation.

15. The integrated circuit of claim 14, wherein the low energy ion implantation is achieved by implanting ions on a surface of the n well and driving the implanted ions into the n well via heat.

16. The integrated circuit of claim 1, wherein the reverse bias voltage applied to the first region is less than a breakdown voltage for a p-n junction between the n well and the p-type substrate.

17. An integrated circuit having a plurality of types of circuits fabricated thereon and comprising:
    a substrate of a first type;
    a first region located on top of the substrate and used to fabricate circuits that are more sensitive to noise;
    a second region located on top of the substrate and used to fabricate circuits that are sources of the noise;
    a well formed on top of the substrate and doped as second type, wherein the well surrounds the first region and separates the first and second regions;
    a depletion region formed between the well and the substrate based on a reverse bias voltage applied to the well; and
    a voltage pump circuit configured to provide the reverse bias voltage that is greater than a supply voltage for the integrated circuit,
    wherein the well doped as the second-type is heavily doped to achieve a particular ion concentration profile.

18. The integrated circuit of claim 17, wherein the first type is p-type and the second type is n-type.

19. The integrated circuit of claim 17, wherein the first type is n-type and the second type is p-type.

20. The integrated circuit of claim 17, wherein the particular ion concentration profile is selected to provide a high breakdown voltage for a p-n junction formed between the well and the substrate.

21. The integrated circuit of claim 17, wherein the particular ion concentration profile is selected to increase a depth and of width of the depletion region for a particular amount of reverse bias voltage.

* * * * *